(12) United States Patent
Kapany

(10) Patent No.: US 8,230,649 B2
(45) Date of Patent: *Jul. 31, 2012

(54) SOLAR WALL APPARATUS AND METHOD

(75) Inventor: Narinder Singh Kapany, Woodside, CA (US)

(73) Assignee: SolarPath, Inc., Palo Alto, CA (US)

( * ) Notice: Subject to any disclaimer, the term of this patent is extended or adjusted under 35 U.S.C. 154(b) by 13 days.

This patent is subject to a terminal disclaimer.

(21) Appl. No.: 12/720,982

(22) Filed: Mar. 10, 2010

(65) Prior Publication Data

US 2012/0031018 A1    Feb. 9, 2012

Related U.S. Application Data

(63) Continuation-in-part of application No. 12/563,052, filed on Sep. 18, 2009, now Pat. No. 8,046,960.

(51) Int. Cl.
*E06B 3/00* (2006.01)
*E06B 3/64* (2006.01)
*E06B 3/677* (2006.01)

(52) U.S. Cl. .............. 52/171.3; 52/204.593; 428/13; 428/34.6; 428/36.91; 359/275; 359/265

(58) Field of Classification Search ............ 52/210–213, 52/171.3, 204.5, 204.6, 204.593, 204.62; 428/13, 34, 215, 216, 336, 428, 442, 432, 428/701, 702, 212; 359/275, 265, 271, 269–270
See application file for complete search history.

(56) References Cited

U.S. PATENT DOCUMENTS

| 3,793,931 A | 2/1974 | Wild |
| 3,936,157 A | 2/1976 | Kapany |
| 4,078,548 A | 3/1978 | Kapany |
| 4,137,098 A | 1/1979 | Field |
| 4,164,123 A | 8/1979 | Smith |
| 4,265,222 A | 5/1981 | Kapany et al. |

(Continued)

FOREIGN PATENT DOCUMENTS

GB    2125531 A    7/1984

(Continued)

OTHER PUBLICATIONS

U.S. Appl. No. 12/563,052, filed Sep. 18, 2009, Kapany.

(Continued)

*Primary Examiner* — Jeanette E. Chapman
(74) *Attorney, Agent, or Firm* — Kilpatrick Townsend & Stockton LLP

(57) ABSTRACT

A construction panel includes a pane, a construction substrate, and a frame that form an air gap there between. An electrical generator, a water circulator, and an air venting system are in the air gap. First and second reflective coatings are respectively on first surfaces of the pane and the construction substrate. The first surfaces face the air gap. The reflective coatings reflect IR to heat water in the water circulator and heat air in the air gap. First and second antireflective coatings are respectively on a second surface of the pane and on the first reflective coating. The second surface faces away from the air gap. The antireflective coatings transmit electromagnetic radiation to the electrical generator for electricity generation. The heated water, heated air, and electricity may be used in a building to which the construction panel is attached. The solar-construction panel includes a multiple-pane window integrally formed therein.

29 Claims, 6 Drawing Sheets

U.S. PATENT DOCUMENTS

| | | | |
|---|---|---|---|
| 4,296,734 A | | 10/1981 | Nevins |
| 4,378,786 A | | 4/1983 | Comeau, Jr. |
| 4,382,435 A | * | 5/1983 | Brill-Edwards ............. 126/622 |
| 4,527,548 A | | 7/1985 | Gustafson |
| 4,577,619 A | | 3/1986 | Howe, Jr. |
| 5,094,055 A | * | 3/1992 | Berdan .................... 52/204.591 |
| 5,128,181 A | | 7/1992 | Kunert |
| 5,221,363 A | | 6/1993 | Gillard |
| 5,231,531 A | * | 7/1993 | Defendini et al. ............ 359/275 |
| 6,018,123 A | | 1/2000 | Takada et al. |
| 6,274,860 B1 | | 8/2001 | Rosenberg |
| 7,270,600 B2 | | 9/2007 | Kim et al. |
| 7,349,144 B2 | * | 3/2008 | Varaprasad et al. .......... 359/267 |
| 7,887,921 B2 | * | 2/2011 | Varanasi et al. ............. 428/432 |
| 8,003,379 B2 | * | 8/2011 | Goldman et al. ......... 435/292.1 |
| 2002/0129849 A1 | | 9/2002 | Heckeroth |
| 2003/0024180 A1 | * | 2/2003 | Hartig et al. ................. 52/204.5 |
| 2006/0156725 A1 | * | 7/2006 | Kenessey .................. 60/641.12 |
| 2007/0184284 A1 | * | 8/2007 | Varaprasad et al. .......... 428/426 |
| 2007/0240369 A1 | | 10/2007 | Brandner |
| 2007/0289231 A1 | | 12/2007 | Nevins |
| 2008/0032620 A1 | | 2/2008 | Chen et al. |
| 2008/0098759 A1 | | 5/2008 | Kuo |
| 2009/0187287 A1 | | 7/2009 | Bruhnke et al. |
| 2009/0320921 A1 | | 12/2009 | Grommesh et al. |
| 2011/0075244 A1 | | 3/2011 | Miller et al. |

FOREIGN PATENT DOCUMENTS

| | | |
|---|---|---|
| WO | WO 2008/000084 A1 | 1/2008 |
| WO | WO 2008/095502 A2 | 8/2008 |

OTHER PUBLICATIONS

International Search Report and Written Opinion of the International Searching Authority for PCT Application No. PCT/US 11/58298, mailed on Jun. 6, 2012, 17 pages.

* cited by examiner

SOLAR WALL APPARATUS AND METHOD

CROSS REFERENCE TO RELATED APPLICATIONS

This application claims priority to, and is a continuation-in-part, of U.S. patent application Ser. No. 12/563,052, titled, "Solar Window Apparatus and Method," filed Sep. 18, 2009, of Narinder Singh Kapany, now U.S. Pat No. 8,046,960, and is incorporated by reference herein in its entirety for all purposes.

BACKGROUND OF THE INVENTION

The present invention generally relates to a solar building apparatus and method for windows and solar walls. More particularly the present invention relates to solar windows and solar walls configured to covert received electromagnetic radiation in electricity and heat.

Traditional windows for buildings have typically been single paned. These single paned windows provide a relatively low level of heat insulation between the inside of the window and the outside the window. Due to the relatively low level of heat insulation of single pane windows, double pane and triple pane windows have been developed, which provide relatively higher levels of heat insulation compared to single pane windows. U.S. Pat. No. 3,793,961 of Wild, U.S. Pat. No. 3,936,157, of Kapany, and U.S. Pat. No. 4,078,548 each describe windows having two panes of glass.

Subsequent to the development of double pane windows, various double pane windows were developed that included photovoltaic cells formed between the panes. The photovoltaic cells in these windows are configured to generate electricity for use away from the windows (e.g., to light a lamp) without obstructing the view through the windows and photovoltaic cells. U.S. Pat. No. 4,137,098 of Field, and U.S. Pat. No. 4,265,222 of Kapany each discuss double pane windows that have photovoltaic cells disposed therein for electricity generation.

As is well known, double pane windows have an air gap between the individual panes in which heated air tends to be trapped. Various double pane windows have been developed to vent the heated air in the air gap to the inside of a window (e.g., into a room in a building), for example, if the inside of the window is colder than desired. These double pane windows are also often configured to vent the heated air from inside a window (e.g., from a room in a building) to the outside of the window (e.g., to the space outside of a building). For example, heat may be vented from inside the window to outside of the window, if the inside of the window is warmer than desired. U.S. Pat. No. 4,577,619 of Howe and international patent publication no. WO 2008/095502 of Arndt each describe a double pane window configured to transfer heated air into a building, or out from a building.

While a number of double pane windows have been developed to use light for electricity generation, and for moving heated air, window designers and manufacturers continue to strive to develop new windows configured for electricity generation, heat transfer, and the like where a relatively higher percentage of received electromagnetic radiation is for usable energy generation compared to known windows.

BRIEF SUMMARY OF THE INVENTION

The present invention generally relates to a solar building apparatus and method for solar windows and solar walls. More particularly the present invention relates to solar windows and solar walls configured to covert received electromagnetic radiation in electricity and heat.

According to one embodiment of the present invention, a solar-construction panel includes a pane and a construction substrate disposed opposite from one another, and aa frame coupling the pane and the construction substrate to form an air gap between the pane, the construction substrate, and the frame. An electrical generator is disposed in the air gap configured to convert electromagnetic radiation to electricity. First and second reflective coatings are respectively disposed on a first surface of the pane and a first surface of the construction substrate. The first surfaces face the air gap. The reflective coatings are configured to reflect infrared radiation into the air gap to generate heated air in the air gap. First and second antireflective coatings are respectively disposed on a second surface of the pane and on the first reflective coating. The second surface faces away from the air gap, and the antireflective coatings are configured to transmit visible light and infrared radiation into the air gap. According to a specific embodiment, the solar-construction panel further includes a multiple-pane window integrally formed with the pane and the construction substrate.

According to a specific embodiment, the solar-construction panel includes a water heating unit configured to collect heat in water in the water heating unit. The water heating unit is configured to move heated water out from the solar-construction panel. The water heating unit may also be configured to move heated water into a building to which the solar-construction panel is attached for use.

According to a specific embodiment of the solar-construction panel, the electrical generator includes a set of photovoltaic panels. The photovoltaic panels may be polymer strips. The polymer strips may be drawn from a reservoir as a sheet and cut to a length of the louvers. The solar-construction panel further includes a set of louvers to which the photovoltaic panels are coupled.

According to a specific embodiment of the solar-construction panel, a venting system configured to selectively vent heat from the air gap in a direction away from the first pane or away from the second pane. The louvers are configured to rotate to orient the photovoltaic panels for optimized energy generation. The solar-construction panel may further include a fan configured to move warm air our from or into the air gap.

A solar-construction panel includes a pane and a construction substrate disposed opposite from one another, and a frame coupling the pane and the construction substrate to form an air gap between the pane, the construction substrate, and the frame. An electrical generator is disposed in the air gap configured to convert electromagnetic radiation to electricity. First and second antireflective coatings are respectively disposed on a first surface and a second surface of the pane. The first surface faces away from the air gap. The second surface faces the air gap. The first and second antireflective coatings are configured to transmit visible light and infrared radiation into the air gap. First and second reflective coatings are respectively disposed on the second antireflective coating and a first surface of the construction substrate. The first surfaces of the construction substrate faces the air gap. The reflective coatings are configured to reflect infrared radiation into the air gap to generate heated air in the air gap. According to a specific embodiment, the solar-construction panel further includes a multiple-pane window integrally formed with the pane and the construction substrate.

According to a specific embodiment, the solar-construction panel includes a water heating unit configured to collect heat in water in the water heating unit. The water heating unit is configured to move heated water out from the solar-construction panel. The water heating unit may also be configured to move heated water into a building to which the solar-construction panel is attached for use.

According to a specific embodiment of the solar-construction panel, the electrical generator includes a set of photovoltaic panels. The photovoltaic panels may be polymer strips. The polymer strips may be drawn from a reservoir as a sheet and cut to a length of the louvers. The solar-construction panel further includes a set of louvers to which the photovoltaic panels are coupled.

According to a specific embodiment of the solar-construction panel, a venting system configured to selectively vent heat from the air gap in a direction away from the first pane or away from the second pane. The louvers are configured to rotate to orient the photovoltaic panels for optimized energy generation. The solar-construction panel may further include a fan configured to move warm air our from or into the air gap.

According to another embodiment of the present invention, a building includes a solar-construction panel as described above.

These and other embodiments of the present invention are described in more detail in conjunction with the text below and the attached figures.

DETAILED DESCRIPTION OF THE INVENTION

The present invention generally provides a solar building apparatus and method for solar windows and solar walls. More particularly the present invention relates to solar windows and solar walls configured to covert received electromagnetic radiation in electricity and heat.

As is well known, a window provides a functional barrier between the inside of a building and the outside of a building. A window allows for the transmission of light to light a room. Windows also allow people to see through the window to view the outside world, for example. Window further provide for heat insulation between the inside of a building and the outside of a building. Window designers and manufactures continue to strive to develop new windows, which provide functions in addition to light transmission, visibility, and heat insulation. For example, window designers and manufacturers have developed windows that are configured to use energy received in electromagnetic radiation to generate electricity. Embodiments of the present invention are directed toward further window improvements, where the windows are configured to use collected electromagnetic radiation for electricity generation and to collect heat for room heating, room cooling, and the like.

Figure 1:
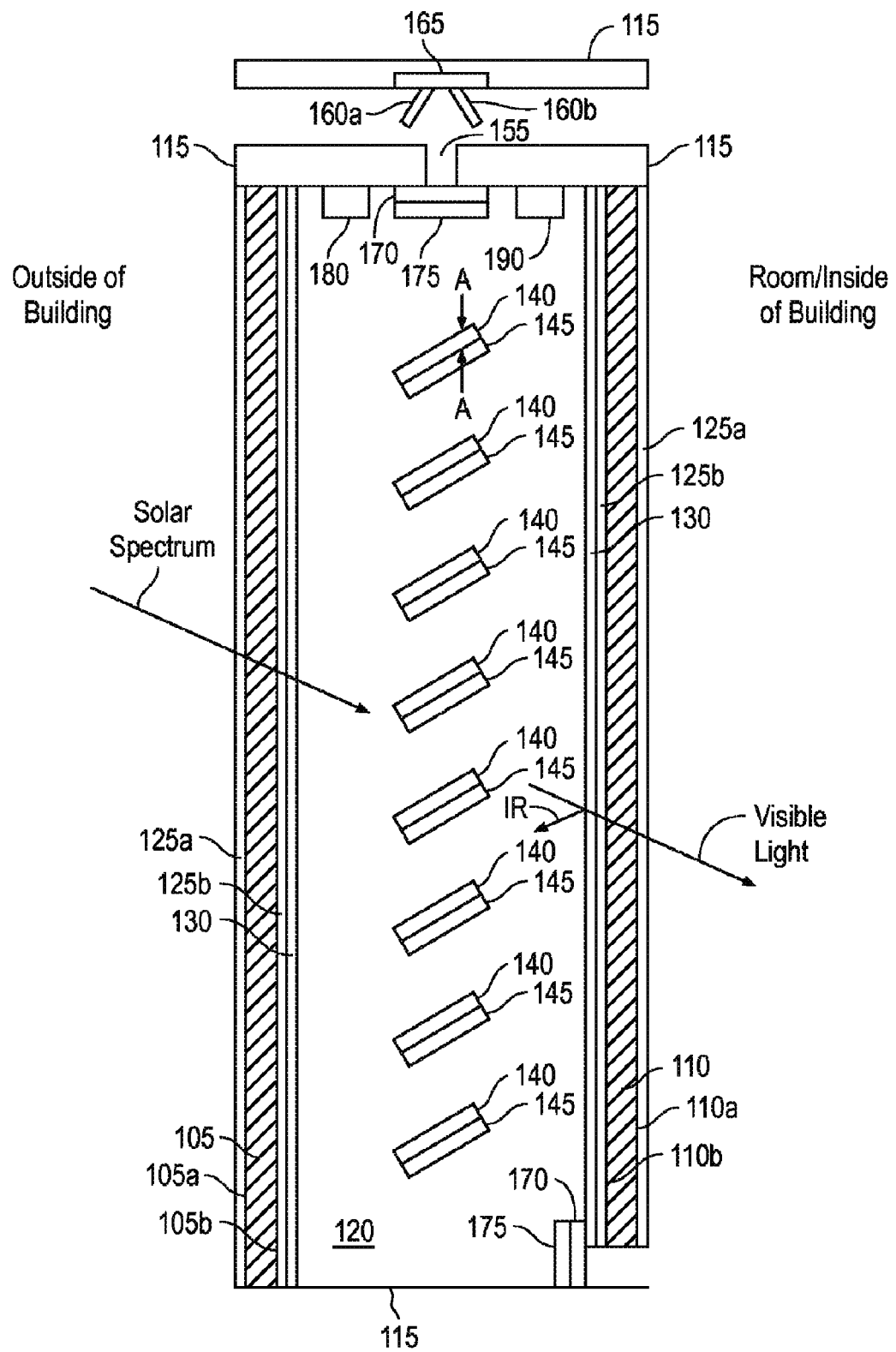
FIG. 1 is a simplified schematic of a multiple-pane window according to one embodiment of the present invention.

FIG. 1 is a simplified schematic of a multiple-pane window 100 according to one embodiment of the present invention. A multiple-pane window as referred to herein includes two or more panes. According to the specific embodiment of FIG. 1, multiple-pane window 100 includes a first pane 105 and a second pane 110. The panes may be glass, plastic, or the like. The first pane and the second pane may be coupled by a frame 115. Frame 115 may be composed of various materials, such as wood, plastic, vinyl, glass, composite material, or other materials. The first pane, the second pane, and the frame may be arranged to form an air gap 120, which is between the panes and the frame.

According to a specific embodiment of the present invention, an outside surface 105$a$ of first pane 105 and an outside surface 110$a$ of second pane 110 are coated with an antireflection coating 125$a$. Antireflection coating 125$a$ may be configured to provide transmission of a relatively broad spectrum of electromagnetic radiation, such as infrared (IR) radiation, visible light, ultraviolet (UV) light, and the like.

According to a further embodiment, an inside surface 105$b$ of first pane 105 and an inside surface 110$b$ of second pane 110 are coated with an antireflection coating 125$b$. Antireflection coating 125$b$, similar to antireflection coating 125$a$, may be configured to provide transmission of a relatively broad spectrum of electromagnetic radiation, such as infrared (IR) radiation, visible light, ultraviolet (UV) light, and the like.

According to another specific embodiment of the present invention, a reflective coating 130 is disposed on antireflection coatings 125$b$ on both panes 105 and 110. Alternatively, reflective coatings 130 may be disposed on the surfaces 105$b$ and 110$b$, and antireflection coatings 125$b$ may be disposed on the reflective coatings. Reflective coatings 130 may be configured to reflect one or more select bandwidths of electromagnetic radiation. For example, reflective coatings 130 may be configured to reflect IR radiation. Providing for the transmission (i.e., antireflection) of electromagnetic radiation at surfaces 105$a$, 105$b$, 110$a$, and 110$b$, and for the reflection of IR radiation at surfaces 105$b$ and 110$b$, the first and second panes provide that heat may be relatively efficiently collected and maintained within air gap 120. Antireflection coatings 125$a$ and 125$b$, and reflective coating 130 may include traditional dielectric layers, or may include other materials, such as relatively thin polymer (e.g., silicone) rubber strips or sheets, which provide transparency and the desired antireflective and reflective properties, where the polymer rubber strips may also be photovoltaic. For convenience, antireflection coatings 125$a$ and 125$b$, and reflective coatings 130, and other elements of multiple-pane window 100 are not drawn to scale.

Multiple-pane window 100 may include a set of photovoltaic panels 140 where the photovoltaic panels are disposed in air gap 120. A set as referred to herein includes one or more elements. According to one embodiment, the photovoltaic panels may be relatively thin panels. For example, the photovoltaic panels may be about 200 micrometers or less thick from front to back (e.g., from A-A). The photovoltaic panels may be configured to convert electromagnetic radiation striking the panels into electricity. The electricity may be configured to be directed to various electrical components inside the multiple-pane window and/or outside the multiple-pane window for external use (e.g., to light a lamp, etc.).

The set of photovoltaic panels may be coupled to a set of louvers 145. The coupling may be one-to-one or one-to-many. That is, one photovoltaic panel may be coupled to one louver, or a plurality of photovoltaic panels may be coupled to one louver. The louvers may be formed of a variety of materials, such as plastic, wood, glass, composite material, or the like. The set of photovoltaic panels may be mechanically coupled to the louvers, chemically coupled to the louvers (e.g., glued, epoxied, etc.), or the like. The photovoltaic panels may be coupled to the louvers at a fixed position or may be configured to be rotatable with respect to the louvers. Those of skill in the art will know how to couple the photovoltaic panels to the louvers so that the photovoltaic panels may be rotatable with respect to the louvers. Antireflection coatings 125a and 125b provide that a relatively high percentage of received electromagnetic radiation (as compared to known windows) is transmitted through the panes to the photovoltaic panels for relatively high electricity generation rates.

Figure 2:
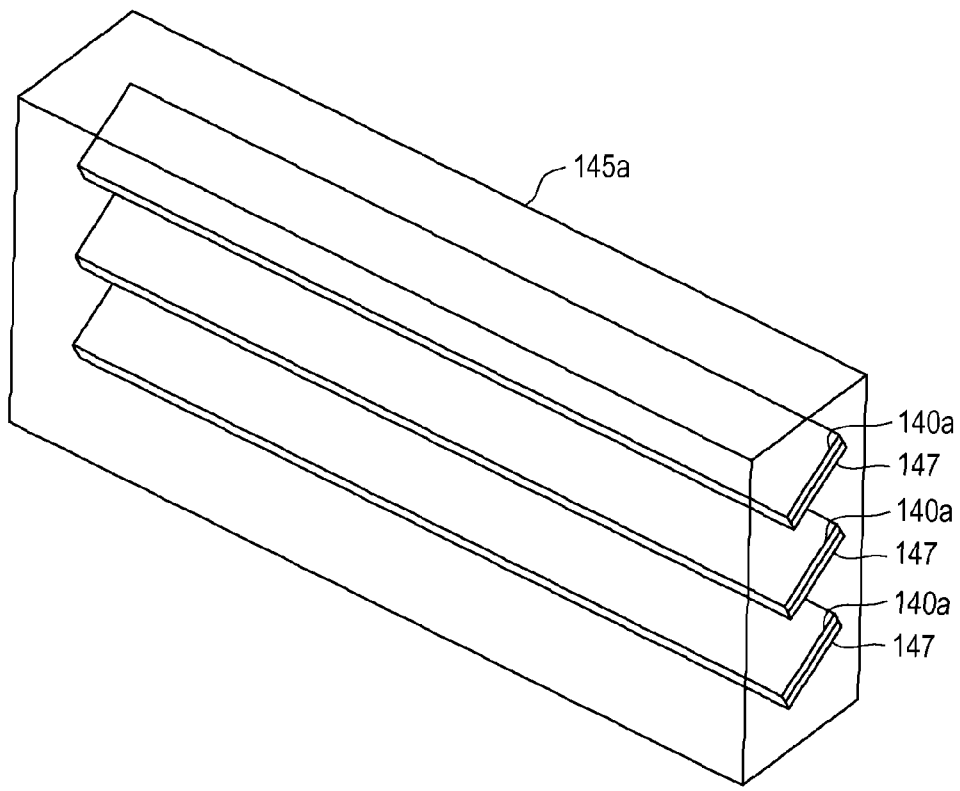
FIG. 2 is a simplified perspective view of a louver having a plurality of photovoltaic panels formed therein according to another embodiment of the present invention.

FIG. 2 is a simplified perspective view of a louver 145a having a plurality of photovoltaic panels 140a formed therein according to an alternative embodiment of the present invention. While louver 145a is shown as including a plurality of photovoltaic panels therein, the louver may alternatively include a single photovoltaic panel. According to one embodiment, each photovoltaic panel is backed with an absorption coating 147. The absorption coatings are configured to absorb electromagnetic radiation passing through the photovoltaic panel and convert the absorbed electromagnetic radiation to heat in the air gap.

According to one embodiment, the louvers may configured to be rotated to provide optimal expose of the photovoltaic panels to electromagnetic radiation striking these photovoltaic panels. Optimal exposure includes a position at which the photovoltaic panels generate a substantial maximum power output for electromagnetic radiation received by the photovoltaic panels. For example, a position at which the louver are oriented for optical expose to electromagnetic radiation is often ninety degrees. That is, the incoming electromagnetic radiation strikes the photovoltaic panel at ninety degrees. The louvers may be configured to be manually rotated by a user, or rotated automatically by one or more motor or the like (not shown). The multiple-pane window may include a detector circuit configured to determine if the photovoltaic panels are optimally positioned with respect to the electromagnetic radiation, and to control the one or motor to adjust the angle of the louvers until the photovoltaic panels are optimally oriented.

According to one embodiment, multiple-pane window 100 has a first opening 150 formed therein at a bottom portion, and has a second opening 155 formed therein at a top portion. First opening 150 may be between air gap 120 and the inside of the window. That is, the first opening may be toward a room in a building. Second opening 155 may be between air gap 120 and the inside of the window and/or the outside of the window. That is, the second opening may be toward a room in a building and/or to the outside of a building.

According to one embodiment, multiple-pane window 100 may include a first shutter 160a and/or a second shutter 160b that may be position at opening 155. First shutter 160a may be positioned toward the outside of the multiple-pane window to regulate the flow of air through opening 155 to the outside of a building. Second shutter 160b may be positioned toward the inside of the multiple-pane window to regulate the flow of air through opening 155 to the inside of a building. The shutters may be configured to be manually opened and closed by a human user, and/or may be configured to be opened and closed by a thermostat 165. The thermostat may be a mechanical device (such as a bimetal spring), an electronic device, an electro-mechanical device, or the like. The thermostat may be configured to be set at a given temperature at which one or both of the first and second shutters may be opened or closed. For example, the thermostat may be configured to open first shutter 160a and close second shutter 160b if the temperature inside a room is say 75 degrees or greater. With the first shutter open, and the second shutter closed warm air is allowed to flow upward from first opening 150 from the room, and outward from second opening 155 out of the room. Thereby, heat collected in the gap is limited from flowing into the room. This example operation of the thermostat and shutters provides that if the room becomes warmer than desired (e.g., say 75 degrees or greater), the multiple-pane window may vent heat from inside a room in a building to outside of the building. Alternatively, if a room is colder than desired, then first shutter 160a may be closed by the thermostat, and second shutter 160b may be opened by the thermostat thereby allowing warm air, which has accumulated inside the air gap, to enter the room. That is, cool air from inside a room may flow through first opening 150, warm in the air gap, and exit into the room through second opening 155.

According to one embodiment of the present invention, a set of fans 170 is disposed in the air gap and/or adjacent to one or both of the openings to push air inside the air gap out through second opening 155 into the room or out from the room. The set of fans may be configured to operate in conjunction with the first and second shutters to move air into the room or move air out from the room. The set of fans 170 may be electrically coupled to the set of photovoltaic panels to draw electricity therefrom for operation. The fan might alternatively be coupled to an external power source. The set of fans may be configured to power on and off under control of the thermostat. The multiple-pane window may include one or more filters 175 disposed in the air gap and/or in one or both of the first and second openings to filter the air that passes into the air gap and/or out from the air gap. The filters may be configured to keep the inner surfaces of the panes clean by removing particulate matter in the air that moves through air gap 120.

According to another embodiment of the present invention, multiple-pane window 100 includes an electric generator 180 configured to turn the heat in the air gap into electrical energy. Electrical generator 180 may by a mechanical generator, a thermal-electric generator, or the like. Electricity generated by electrical generator 180 may be directed out from the multiple-pane window for external use, may be directed internally to operate the thermostat, the set of fans, and/or the like. As the multiple-pane window may include two electricity generation systems, namely the photovoltaic panels and the electric generator, the multiple-pane window is configured to use a relatively larger amount of energy supplied to the window from electromagnetic radiation as compared with other known energy generating windows.

According to another embodiment of the present invention, multiple-pane window includes a water heating unit 190. The water heating unit may be disposed in the air gap to collect the heat therein to heat the water. Water may be fed into water heating unit 190 from outside the multiple-pane window and dispensed from multiple-pane window for external use. The water heating unit might include a set of tubes or the like through with the water is configured to move to provide relatively optimal exposure of the water to the heat inside the air gap.

Figure 3:
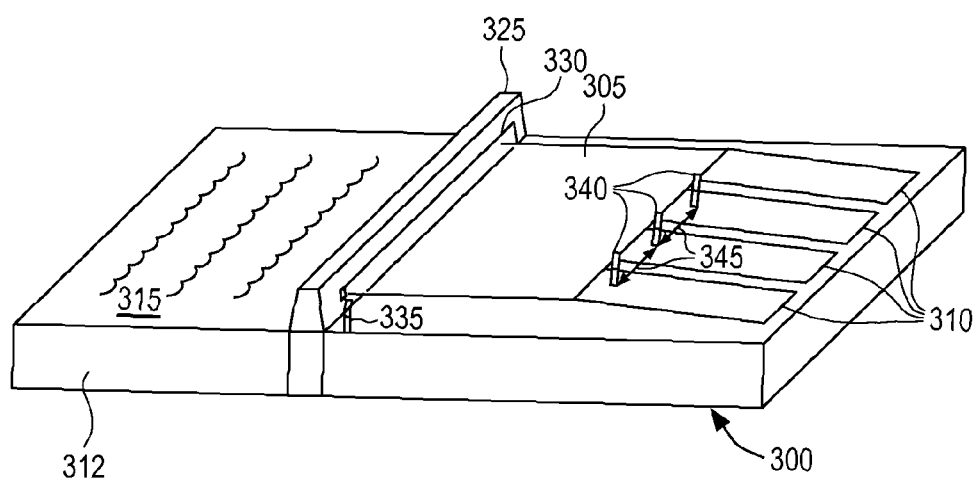
FIG. 3 is a simplified schematic of a extrusion device configured for use to manufacture relatively thin photovoltaic strips according to one embodiment of the present invention.

According to another embodiment of the present invention, an apparatus and a method are provided for generating a relatively thin photovoltaic sheet and relatively thin photovoltaic strips. The relatively thin photovoltaic sheet and/or the relatively thin photovoltaic strips may be generated for placement on a multiple-pane window, such as on the panes or on the louvers of multiple-pane window 100. FIG. 3 is a simplified schematic of an extruder device 300 configured for use to manufacture a relatively thin photovoltaic sheet 305 and/or relatively thin photovoltaic strips 310. Extruder device 300 may include a reservoir 312, in which a polymer material 315 may be deposited. The polymer material may be a substantially liquid photovoltaic material in the reservoir. For the polymer material, the relatively thin photovoltaic sheets and/or the relatively thin photovoltaic strips may be drawn. Polymer material 315 may be a silicone based material or the like. According to one embodiment, extruder device 300 includes an extruder element 325. The extruder elements may include an aperture 330, rollers (not shown), or the like formed therein from which the relatively thin photovoltaic sheet 305 may be drawn. According to one embodiment, the extruder device may include a cutting element 335 configured for cutting the relatively thin photovoltaic sheet to a desired length. The cutting element may be configured to travel along the length of the extruder element to cut the relatively thin photovoltaic sheet.

According to another embodiment, extruder device 300 includes a set of cutters 340, which are configured to cut the relatively thin photovoltaic sheet 305 into a set of relatively thin photovoltaic strips 310. The cutters in the set of cutters may include knife blades, roller cutters or the like for piercing the relatively thin photovoltaic sheet to form the relatively thin photovoltaic strips. According to a further embodiment, the cutters in set 340 may be configured to be moved relative to one another so that a width of each relatively thin photovoltaic strip may be set to as desired. Arrows 345 indicate the directions in which the cutters may be moved to set the width at which the relatively thin photovoltaic strips are cut. According to an alternative embodiment, extruder element 325 may include a set of apertures, a set of rollers or the like formed from which the relatively thin photovoltaic strips 310 may be drawn.

Figure 4:
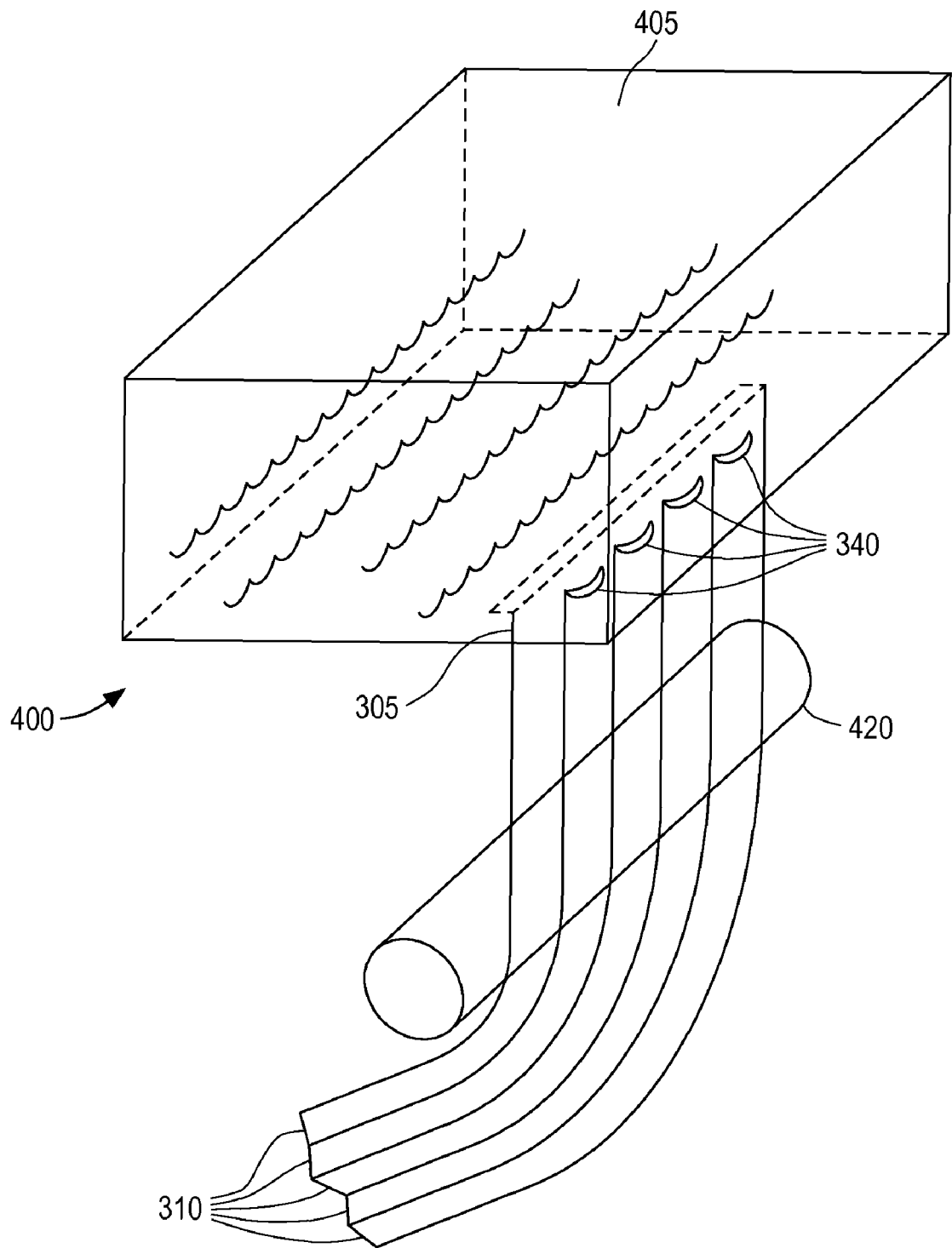
FIG. 4 is a simplified schematic of one embodiment of an extruder for extruding relatively thin photovoltaic strips according to one embodiment of the present invention.

FIG. 4 is a simplified schematic of one embodiment of an extruder device 400 according to one embodiment of the present invention. Various portions of the extruder device not visible in the perspective view of FIG. 4 are shown with phantom lines. The extruder device might include a reservoir 405 in which a polymer material 315 may be disposed. The polymer material may be a substantially liquid photovoltaic material in the reservoir. From the polymer material, relatively thin photovoltaic sheets 305 and/or relatively thin photovoltaic strips 310 may be drawn. The extruder device may include an aperture 410 formed therein from which relatively thin photovoltaic sheet 305 may be drawn. The extruder device may include other forming devices such as a roller 420 or the like. The extruder device may include a set of cutters (not shown), such as cutters 340 described above with respect to extruder device 300. The cutters may be configured to cut the relatively thin photovoltaic sheet into the relatively thin photovoltaic strips. According to one embodiment, the relatively thin photovoltaic strips may be relatively long. For example, the relatively thin photovoltaic strip may be of a length sufficient to extend from one end of a louver in a window to the opposite end of the louver. The relatively thin photovoltaic strips may be cut to a desired length while the strips are being drawn. For example, the relatively thin photovoltaic strip might be cut few inches long or several inches long (e.g., 10 inches, 40 inches, 100 inches, etc.). A relatively thin photovoltaic strips may be coupled to a louver by a variety of techniques, such as mechanical coupling, chemical bonding, or the like. The relatively thin photovoltaic strip may be substantially transparent to the visible spectrum of light that is not converted into electricity by the thin photovoltaic strips. The louvers to which the relatively thin photovoltaic strip is coupled may be plastic, metal, or the like. According to another embodiment, the relatively thin photovoltaic strip may be placed inlayers on a louver or on a pane of a multiple-pane window. Other relatively thin photovoltaic sheets might alternatively be plastic based and may be coupled to the louvers or panes of a multiple-pane window. The relatively thin photovoltaic strips and/or the relatively thin photovoltaic sheets might be coated to the panes to provide for the transmission and reflective coatings discussed above.

According to one embodiment, aperture 410 is oriented downward so that gravity may assist in pulling the polymer from the aperture. Roller 420 may be configured to be rotated by a motor or the like to place tension on the polymer as it is drawn from the reservoir to form the relatively thin photovoltaic sheet and/or strips to a desired thickness.

Figure 5:
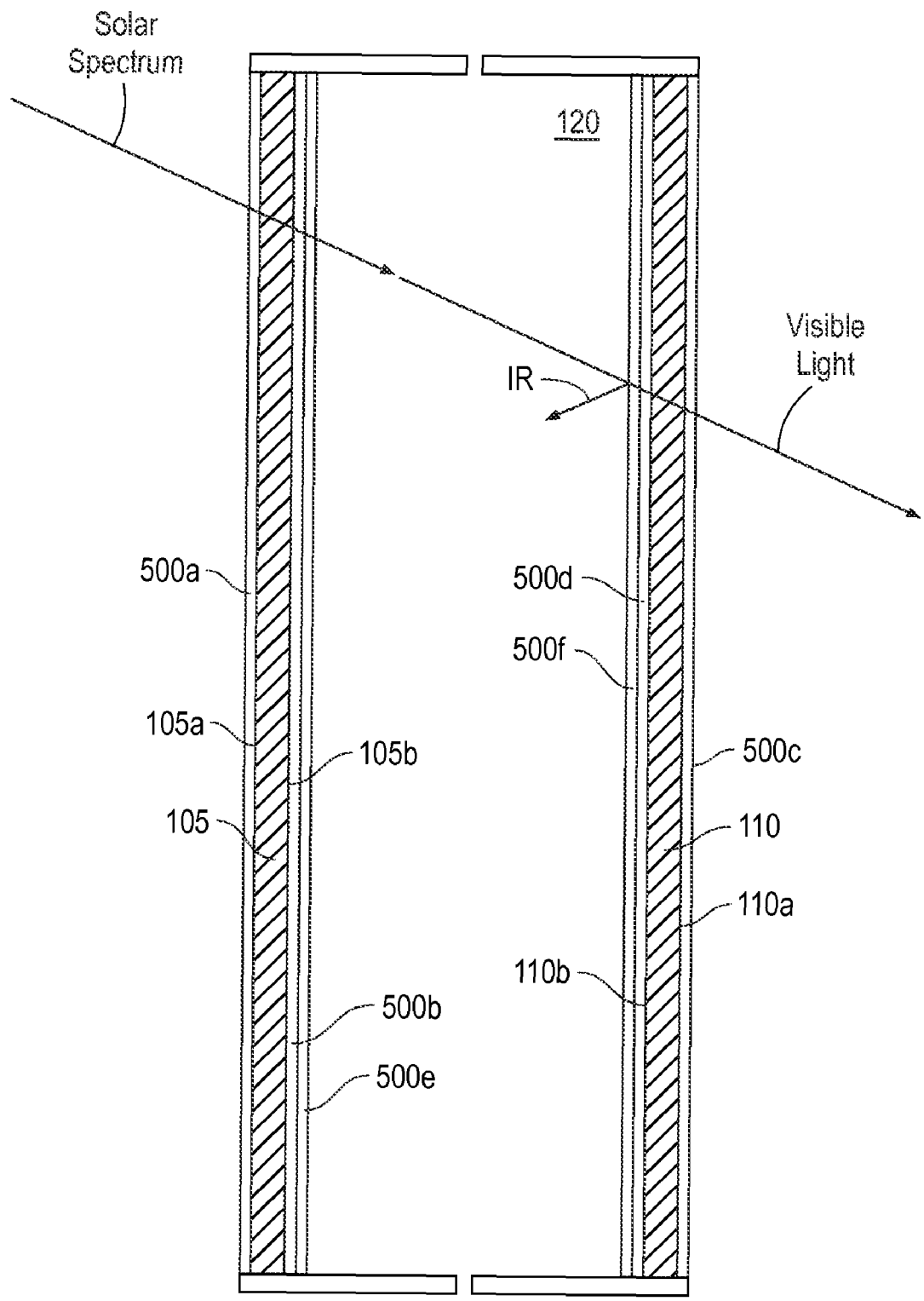
FIG. 5 is a simplified schematic of a multiple-pane window to which a set of photovoltaic coating is applied.

FIG. 5 is a simplified schematic of a multiple-pane window to which a set of photovoltaic coatings 500 is applied. A first photovoltaic coating 500a may be coupled to the outside surface 105a of first pane 105, and a second photovoltaic coating 500b may be coupled to the inside surface 105b of first pane 105. A third photovoltaic coating 500c may be coupled to the outside surface 110a of second pane 110, and a fourth photovoltaic coating 500d may be coupled to the inside surface 1105 of second pane 110. Coatings 500a, 500b, 500c, and 500d may be antireflection coatings, and have a relatively high transmission coefficient (e.g., 95% or greater transmission) in the solar spectrum. According to a further embodiment, photovoltaic coatings 500e and 500f are disposed over photovoltaic coatings 500b and 500d, respectively. Alternatively, photovoltaic coating 500e and 500f may be coupled to the surfaces 105b and 110b, respectively, and photovoltaic coatings 500b and 500d may be respectively disposed over the photovoltaic coatings 500b and 500d. Photovoltaic coatings 500e and 500f may be antireflective coating in the IR spectrum so that heat may be trapped by these coatings in air gap 120. The photovoltaic coating may be a single piece of plastic type photovoltaic material or multiple pieces of plastic type photovoltaic material. The photovoltaic coating may be relatively thin photovoltaic sheet 305 and/or multiple pieces of relatively thin photovoltaic strip 310. The multiple-pane window shown in FIG. 5 may include each of the elements of multiple-pane window 100 described above, such as a set of louvers with photovoltaic strips, electric generator configured to convert heat in the window to electricity or the like, a fan, filters, etc. These elements described above with respect to multiple-window pane 100 are not shown in FIG. 5 for convenience.

Figure 6A:
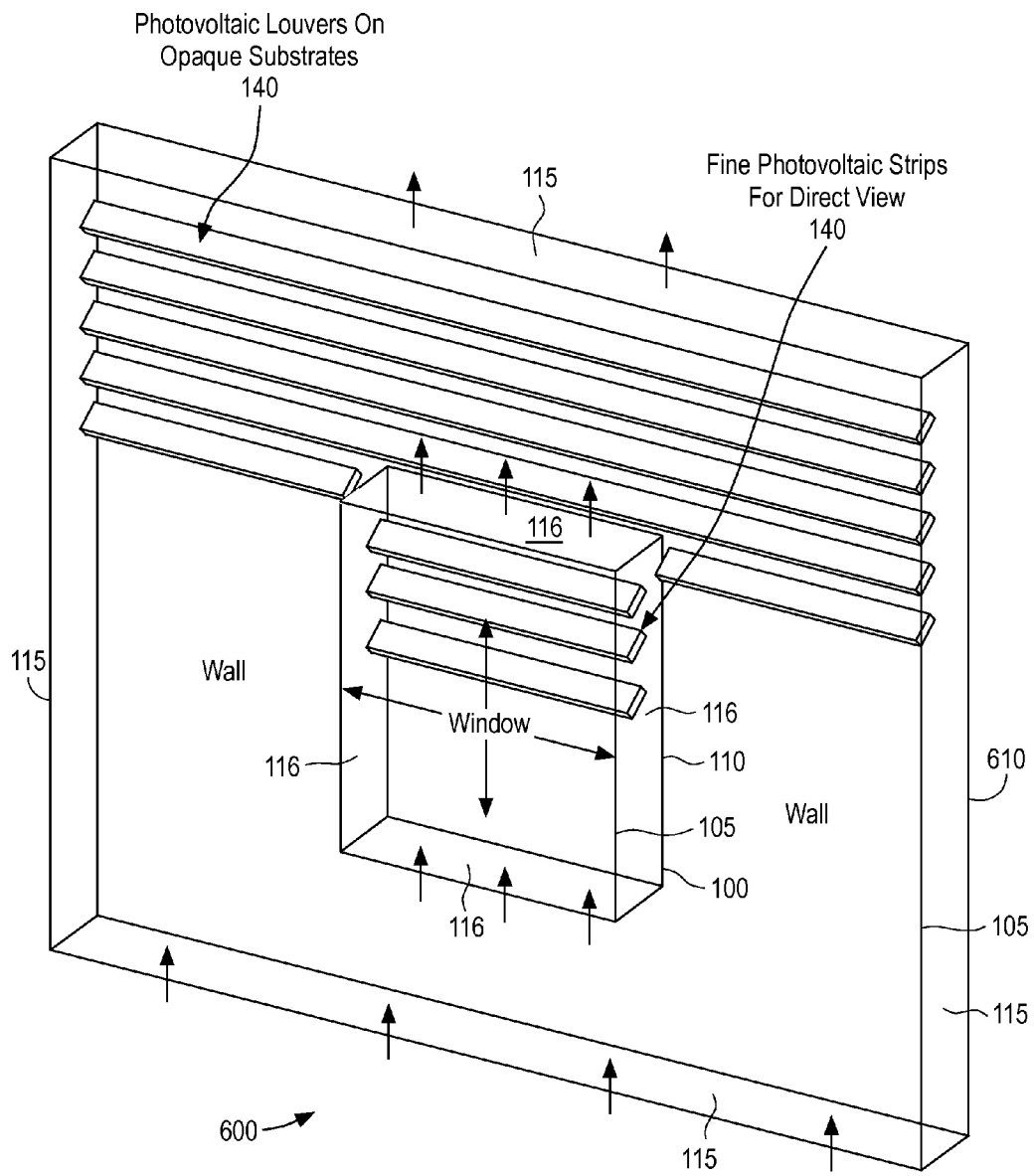
FIG. 6A is a simplified schematic of a solar-construction panel configured to be disposed on a wall of a building or the like according to one embodiment of the present invention.
Figure 6B:
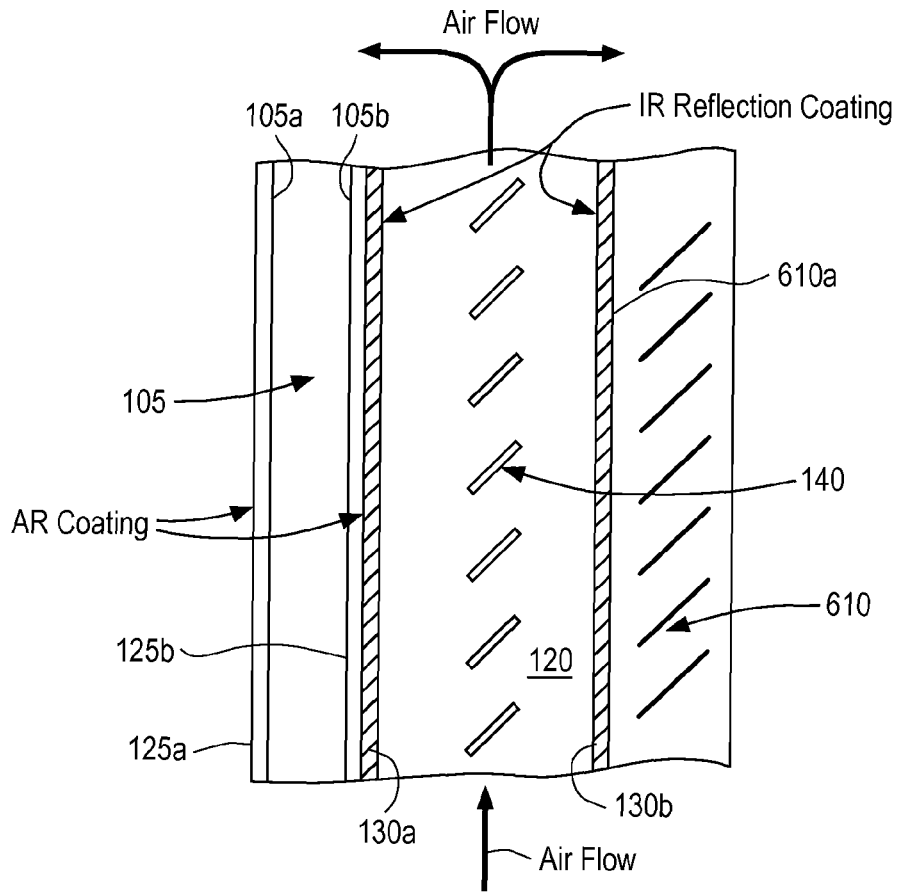
FIG. 6B is a cross-section view of the solar-construction panel according to one embodiment of the present invention.

FIG. 6A is a simplified schematic of a solar-construction panel 600 configured to be coupled to a wall of a building, form a portion of a wall of a building, or the like according to one embodiment of the present invention. FIG. 6B is a cross-sectional view of solar-construction panel 600 according to one embodiment of the present invention. The cross-sectional view is from a side (mark "A") of the solar-construction panel shown in FIG. 6A. The same numeral scheme used above with respect to the description of multiple-pane window 100 is used for the same or substantially similar elements of solar-construction panel 600.

Solar-construction panel 600 is configured to be placed on one or more exterior walls of a building to collect solar radiation for conversion of the solar radiation to electricity, heating a fluid, or the like. The electricity generated by the solar-construction panel may be used to power various electrical devices of the solar-construction panel, may be used to power various electrical devices of the building to which the solar-construction panel is attached or of another building, charge a battery, power various electrical devices outside of the building to which the solar-construction panel is attached, etc. A fluid as referred to here in may include a liquid or a gas.

According to one embodiment of the present invention the solar-construction panel is integrally formed with a multiple-pane window 100 (described above). According to an alternative embodiment, the solar-construction panel does not include a window formed therein, but includes an aperture formed therein to accommodate an existing window of a building, or to receive a window therein. The window fitted into the aperture may be multiple-pane window 100 or other window. The solar-construction panel may be configured to cover an existing wall of a building to "retro-fit" the building to include the solar-construction panel. The solar-construction panel may be configured for use in new building construction. The solar-construction panel may be configured to be fitted over existing building materials such as stucco, wood, brick, siding (e.g., aluminum, vinyl, wood, etc.), pre-stressed concrete, cinderblocks, etc. The construction panel may be configured to coupled to the wooden studs, the metal studs, etc. of a building. The solar-construction panel may be configured to be coupled to a wall of a building by any of a number of techniques, such as nailing, screwing, gluing, mechanical coupling, welding, a combination of these techniques, or the like.

According to one embodiment, solar-construction panel 600 includes a pane 105 and a construction substrate 610. The pane may be glass, plastic, or the like. According to an embodiment of the solar-construction panel that includes an integrally formed multiple-pane window 100, pane 105 may be the first pane of multiple-pane window 100. The construction substrate may be glass, plastic, wood, concrete, metal, a composite material, a combination of these materials, or other material. According to the embodiment of the solar-construction panel that includes an integrally formed multiple-pane window 100, the construction substrate may be composed of a combination of elements. For example, the portion of the construction substrate at which the multiple-pane window is located may include a pane 110, whereas the portion of the construction substrate not at the location of the multiple-pane window may be formed of a different material. One might also think of this particular embodiment as the construction substrate as including an aperture formed therein at the location of the multiple-pane window and a pane 110 being located at the aperture or in the aperture.

According to one embodiment, pane 105 and construction substrate 610 may be coupled by a frame 115. The frame may be composed of one or more of a variety of materials, such as wood, plastic, vinyl, glass, composite material, metal, or other materials. The pane, the construction substrate, and the frame may be arranged to form an air gap 120, which is between the pane, the construction substrate, and the frame. According to an embodiment of the solar-construction panel that includes an integrally formed multiple-pane window 100, pane 105 may be the first pane of multiple-pane window 100. Further, according to the embodiment of the solar-construction panel that includes a multiple-pane window 100, which is integrally formed with the solar-construction panel, the portion of the solar-construction panel at which the multiple-pane window is located might include a second frame 116, which outlines the multiple-pane window. Alternatively, the solar-construction panel that includes a multiple-pane window 100, which is integrally formed with the solar-construction panel, the portion of the solar-construction panel at which the multiple-pane window is located might not include second frame 116, and air gap 120 may be substantially uninterrupted across the solar-construction panel.

According to one embodiment of the present invention, an outside surface 105a and an inside surface 105b of pane 105 are coated with an antireflection coating 125a and 125b, respectively. Antireflection coatings 125a and 125b may be configured to provide transmission of a relatively broad spectrum of electromagnetic radiation, such as infrared (IR) radiation, visible light, ultraviolet (UV) light, and the like. The antireflection coatings provide than a substantially maximum amount of solar radiation is transmitted through pane 105 into air gap 120.

According to another embodiment, a reflective coating 130a is disposed on antireflection coating 125a. Alternatively, reflective coating 130a may be disposed on surface 105b, and antireflection coatings 125b may be disposed on the reflective coatings. A reflective coating 130b may be disposed a surface 610a of construction substrate 610. Reflective coatings 130a and 130b may be configured to reflect one or more select bandwidths of electromagnetic radiation. For example, reflective coatings 130a and 130b may be configured to reflect IR radiation. Providing for the transmission (i.e., antireflection) of electromagnetic radiation at surfaces 105a, 105b, and for the reflection of IR radiation at surfaces 105b and 610a, the pane and the construction substrate provide that heat may be relatively efficiently collected and maintained within air gap 120.

Solar-construction panel 600 may include a set of photovoltaic panels 140 where the photovoltaic panels are disposed in air gap 120. Photovoltaic panels 140 are described in detail above. The photovoltaic panels may be disposed on opaque substrates, such as louver described above. The electricity generated of the photovoltaic panels may be used to power electrical appliances in the building or the like. According to another embodiment, the solar-construction panel also includes a water heating unit (such as a water heating unit 190 described above). The water heating unit may includes a set of tubes or pipes through with water may be run where the water is configured to collect heat from the air gap. The heated water may be used for a variety of purposes, such as heating the building, personal use (drinking, cooking, bathing, etc.), or the like. The solar-construction panel may includes one or more of a variety of electrical connectors for connection the photovoltaic panels of the solar-construction panel to the power supply of a house, a set of batteries or the like.

Figure 6C:
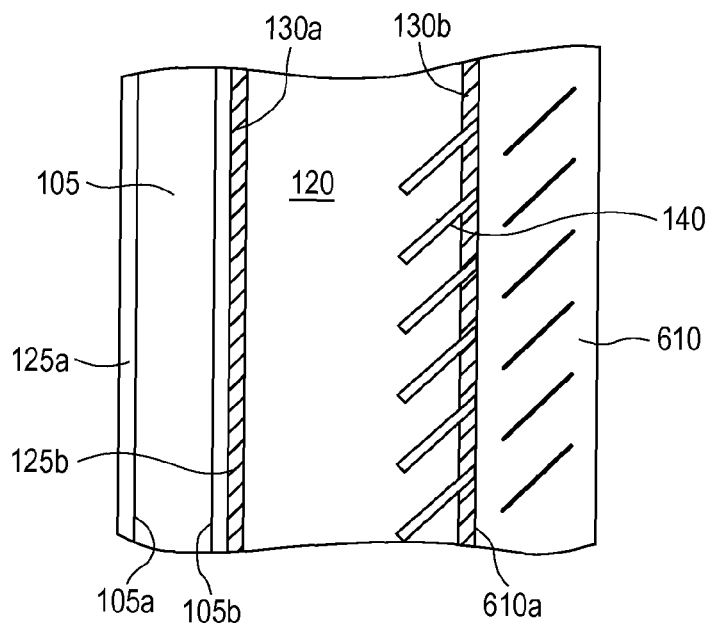
FIG. 6c is a cross-section view of the solar-construction panel according to another embodiment of the present invention.

The set of photovoltaic panels may be coupled to a set of louvers (as described above) or may be coupled to construction substrate 610 as shown in FIG. 6C. The coupling of the photovoltaic panels may be coupled to the louvers one-to-one or one-to-many. That is, one photovoltaic panel may be coupled to one louver, or a plurality of photovoltaic panels may be coupled to one louver. The louvers may be formed of a variety of materials, such as plastic, wood, glass, composite material, or the like. The set of photovoltaic panels may be mechanically coupled to the louvers, chemically coupled to the louvers (e.g., glued, epoxied, etc.), or the like. The photovoltaic panels may be coupled to the louvers at a fixed position or may be configured to be rotatable with respect to the louvers. Those of skill in the art will know how to couple the photovoltaic panels to the louvers so that the photovoltaic panels may be rotatable with respect to the louvers. Antireflection coatings 125a and 125b provide that a relatively high percentage of received electromagnetic radiation (as compared to known windows) is transmitted through the panes to the photovoltaic panels for relatively high electricity generation rates. While the photovoltaic panels 140 are shown in FIGS. 6A-6C to be disposed at a non-zero angle with respect to the plane of the construction substrate, the photovoltaic panels may in one embodiment be disposed substantially parallel the plane of the construction substrate.

The solar-construction panel may include a set of fans (such as fans 170 described above) to move warm air into or out from a building. The solar-construction panel may also include various shutters, openings, passages, and the like (as describe above) for moving heated air into and out from a building.

The solar-construction panel may have a variety of useful sizes and shapes to conform to the size and shapes of various buildings. For example, a solar-construction panel may be relatively large and configured to cover an outside wall of a house, a building or the like. The solar-construction panel may include various aperture formed therein to accommodate a window, an electrical outlet, an air vent, a duct, or the like.

It is to be understood that the examples and embodiments described above are for illustrative purposes only and that various modifications or changes in light thereof will be suggested to persons skilled in the art, and are to be included within the spirit and purview of this application and scope of the appended claims. Therefore, the above description should not be understood as limiting the scope of the invention as defined by the claims.

What is claimed is:

1. A solar-construction panel comprising:
   a pane and a construction substrate disposed opposite from one another;
   a frame coupling the pane and the construction substrate to form an air gap between the pane, the construction substrate, and the frame;
   an electrical generator disposed in the air gap configured to convert electromagnetic radiation to electricity;
   first and second reflective coatings respectively disposed on a first surface of the pane and a first surface of the construction substrate, wherein:
      the first surfaces face the air gap, and
      the reflective coatings are configured to reflect infrared radiation into the air gap to generate heated air in the air gap; and
   first and second antireflective coatings respectively disposed on a second surface of the pane and on the first reflective coating, wherein the second surface faces away from the air gap, and the antireflective coatings are configured to transmit visible light and infrared radiation into the air gap.

2. The solar-construction panel of claim 1, further comprising a multiple-pane window.

3. The solar-construction panel of claim 2, wherein the multiple-pane window is integrally formed with the pane and the construction substrate.

4. The solar-construction panel of claim 1, wherein the electrical generator includes a set of photovoltaic panels.

5. The solar-construction panel of claim 4, wherein the photovoltaic panels are polymer strips.

6. The solar-construction panel of claim 5, further comprising a set of louvers to which the photovoltaic panels are coupled.

7. The solar-construction panel of claim 1, a venting system configured to selectively vent heat from the air gap in a direction away from the first pane or away from the second pane.

8. The solar-construction panel of claim 6, wherein the polymer strips are drawn from a reservoir as a sheet and cut to a length of the louvers.

9. The solar-construction panel of claim 6, wherein the louvers are configured to rotate to orient the photovoltaic panels for optimized energy generation.

10. The solar-construction panel of claim 1, further comprising a fan configured to move warm air our from or into the air gap.

11. The solar-construction panel of claim 1, further comprising a water heating unit configured to collect heat in water in the water heating unit.

12. The solar-construction panel of claim 11, wherein the water heating unit is configured to move heated water out from the solar-construction panel.

13. The solar-construction panel of claim 11, wherein the water heating unit is configured to move heated water into a building to which the solar-construction panel is attached for use.

14. A solar-construction panel comprising:
   a pane and a construction substrate disposed opposite from one another;
   a frame coupling the pane and the construction substrate to form an air gap between the pane, the construction substrate, and the frame;
   an electrical generator disposed in the air gap configured to convert electromagnetic radiation to electricity;
   first and second antireflective coatings respectively disposed ona first surface and a second surface of the pane, wherein:
      the first surface faces away from the air gap,
      the second surface faces the air gap, and
      the first and second antireflective coatings are configured to transmit visible light and infrared radiation into the air gap; and
   first and second reflective coatings respectively disposed onthe second antireflective coating and a first surface of the construction substrate, wherein:
      the first surfaces of the construction substrate faces the air gap, and
      the reflective coatings are configured to reflect infrared radiation into the air gap to generate heated air in the air gap.

15. The solar-construction panel of claim 14, further comprising a multiple-pane window.

16. The solar-construction panel of claim 15, wherein the multiple-pane window is integrally formed with the pane and the construction substrate.

17. The solar-construction panel of claim 14, wherein the electrical generator includes a set of photovoltaic panels.

18. The solar-construction panel of claim 17, wherein the photovoltaic panels are polymer strips.

19. The solar-construction panel of claim 18, further comprising a set of louvers to which the photovoltaic panels are coupled.

20. The solar-construction panel of claim 14, a venting system configured to selectively vent heat from the air gap in a direction away from the first pane or away from the second pane.

21. The solar-construction panel of claim 20, wherein the polymer strips are drawn from a reservoir as a sheet and cut to a length of the louvers.

22. The solar-construction panel of claim 20, wherein the louvers are configured to rotate to orient the photovoltaic panels for optimized energy generation.

23. The solar-construction panel of claim 14, further comprising a fan configured to move warm air our from or into the air gap.

24. The solar-construction panel of claim 14, further comprising a water heating unit configured to collect heat in water in the water heating unit.

25. The solar-construction panel of claim 24, wherein the water heating unit is configured to move heated water out from the solar-construction panel.

26. The solar-construction panel of claim 24, wherein the water heating unit is configured to move heated water into a building to which the solar-construction panel is attached for use.

27. A building comprising the solar-construction panel of claim 1.

28. A building comprising the solar-construction panel of claim 13.

29. A multiple-pane window comprising:

first and second panes opposite from one another;

a frame coupled to the first and second panes to form an air gap between the first pane, the second pane, and the frame;

a plurality of louvers disposed in the air gap a plurality of photovoltaic panels coupled to the louvers, the photovoltaic panels configured to convert electromagnetic radiation to electricity;

a venting system configured to selectively vent heat from the air gap in a direction away from the first pane or away from the second pane;

first and second reflective coatings respectively disposed onfirst surfaces of the first and second panes, wherein the first surfaces face the air gap, and the reflective coatings are configured to reflect infrared radiation into the air gap to generate heated air in the air gap; and first and second antireflective coatings respectively disposed onsecond surfaces of the first and second panes, wherein the second surfaces face away from the air gap, and the antireflective coatings are configured to transmit visible light and infrared radiation into the air gap.

* * * * *